US009768586B2

(12) United States Patent
Huang et al.

(10) Patent No.: US 9,768,586 B2
(45) Date of Patent: Sep. 19, 2017

(54) COMPACT WDM OPTICAL MODULES (71) Applicant: Oplink Communications, LLC, Fremont, CA (US)

(72) Inventors: Sung-Ping Huang, Hsinchu (TW); Zuon-Min Chuang, Taoyuan (TW); Domenico Di Mola, Fremont, CA (US)

(73) Assignee: Oplink Communications, LLC, Fremont, CA (US)

( * ) Notice: Subject to any disclaimer, the term of this patent is extended or adjusted under 35 U.S.C. 154(b) by 0 days.

(21) Appl. No.: 15/262,855

(22) Filed: Sep. 12, 2016

(65) Prior Publication Data

US 2016/0380406 A1 Dec. 29, 2016

Related U.S. Application Data

(62) Division of application No. 14/273,858, filed on May 9, 2014, now Pat. No. 9,444,218.

(51) Int. Cl.
| | |
|---|---|
| *H01S 3/13* | (2006.01) |
| *H01S 3/081* | (2006.01) |
| *H01S 3/08* | (2006.01) |
| *H01S 5/068* | (2006.01) |
| *G02F 1/095* | (2006.01) |
| *G01J 1/42* | (2006.01) |
| *G01J 1/04* | (2006.01) |
| *G02B 27/28* | (2006.01) |
| *H01S 5/40* | (2006.01) |
| *H01S 3/10* | (2006.01) |
| *H04J 14/02* | (2006.01) |

(Continued)

(52) U.S. Cl.
CPC ............ *H01S 5/068* (2013.01); *G01J 1/0459* (2013.01); *G01J 1/4228* (2013.01); *G02B 27/28* (2013.01); *G02F 1/0955* (2013.01); *H01S 3/10* (2013.01); *H01S 5/0261* (2013.01); *H01S 5/0264* (2013.01); *H01S 5/02415* (2013.01); *H01S 5/0656* (2013.01); *H01S 5/06821* (2013.01); *H01S 5/14* (2013.01); *H01S 5/4006* (2013.01); *H01S 5/5045* (2013.01); *H04J 14/02* (2013.01); *H01S 5/005* (2013.01); *H01S 5/0078* (2013.01); *H01S 5/02208* (2013.01); *H01S 5/02284* (2013.01); *H01S 5/5018* (2013.01); *H01S 5/5036* (2013.01); *H04B 10/503* (2013.01)

(58) Field of Classification Search
CPC .... H01S 5/068; H01S 5/02415; H01S 5/0261; H01S 5/14; H01S 5/0264; H01S 5/0656; H01S 5/5045; H01S 5/5036; H01S 3/10; H01S 5/4006; H01S 5/06821; H04J 14/02; G02B 27/28; G01J 1/0459; G01J 1/4228; G02F 1/0955; H04B 10/503
See application file for complete search history.

(56) References Cited

U.S. PATENT DOCUMENTS

6,055,081 A 4/2000 Koyano
6,501,551 B1 12/2002 Tearney
(Continued)

*Primary Examiner* — Yuanda Zhang
(74) *Attorney, Agent, or Firm* — Bo Huang (57) ABSTRACT

Methods, systems, and apparatus, for optical communication. One apparatus includes a Fabry-Perot (FP) laser diode assembly coupled to a first port of a circulator; an optical amplifier coupled to a second port of the circulator; a wavelength division multiplexer (WDM) filter coupled to a third port of the circulator; and a Faraday rotator mirror coupled to the WDM filter.

17 Claims, 6 Drawing Sheets

(51) Int. Cl.
    *H01S 5/065*    (2006.01)
    *H01S 5/024*    (2006.01)
    *H01S 5/026*    (2006.01)
    *H01S 5/14*    (2006.01)
    *H01S 5/00*    (2006.01)
    *H01S 5/022*    (2006.01)
    *H01S 5/50*    (2006.01)
    *H04B 10/50*    (2013.01)

(56) References Cited

U.S. PATENT DOCUMENTS

| | | |
|---|---|---|
| 7,177,330 B2 | 2/2007 | Wai |
| 7,903,979 B2 | 3/2011 | Lee |
| 8,208,196 B2 | 6/2012 | Fermann |
| 8,606,107 B2 | 12/2013 | Bai |
| 2001/0004290 A1 | 6/2001 | Lee |
| 2002/0008901 A1 | 1/2002 | Kinoshita |
| 2002/0118363 A1 | 8/2002 | Akikuni |
| 2004/0101305 A1 | 5/2004 | Jung |
| 2005/0036527 A1 | 2/2005 | Khazael |
| 2005/0123298 A1 | 6/2005 | Kim |
| 2005/0180469 A1 | 8/2005 | Chi |
| 2005/0213103 A1 | 9/2005 | Everett |
| 2005/0259989 A1 | 11/2005 | Sorin |
| 2006/0083515 A1 | 4/2006 | Hann |
| 2006/0109477 A1 | 5/2006 | Zhou |
| 2008/0054160 A1 | 3/2008 | Yao |
| 2008/0131127 A1 | 6/2008 | Lee |
| 2008/0279557 A1 | 11/2008 | Park |
| 2009/0080880 A1 | 3/2009 | Lee |
| 2009/0268276 A1 | 10/2009 | Lee |
| 2010/0046950 A1 | 2/2010 | Cao |
| 2010/0142950 A1 | 6/2010 | Pincemin |
| 2010/0316378 A1 | 12/2010 | Yeh |
| 2012/0020616 A1 | 1/2012 | Babie |
| 2012/0141128 A1 | 6/2012 | Bai |
| 2013/0069628 A1 | 3/2013 | Konno et al. |
| 2013/0163620 A1 | 6/2013 | Lecoeche |
| 2014/0092710 A1 | 4/2014 | Farhadiroushan |
| 2014/0176958 A1* | 6/2014 | Flanders ................. H01S 5/183 356/479 |
| 2015/0184994 A1* | 7/2015 | Flanders ............ G01B 9/02004 356/479 |
| 2015/0311669 A1 | 10/2015 | Chuang |

\* cited by examiner

COMPACT WDM OPTICAL MODULES

CROSS-REFERENCE TO RELATED APPLICATIONS

This patent application is a divisional of U.S. Ser. No. 14/273,858, filed 9 May 2014, which is incorporated by reference in its entirety and which claims priority to U.S. Provisional Patent Application 61/821,948, which was filed on May 10, 2013, and which is incorporated here by reference.

BACKGROUND

This specification relates to optical communication.

Wavelength Division Multiplexing (WDM) technology has been widely used in optical fiber communications to increase the transmission capacity for point to point data transmission through a single optical fiber. Various conventional WDM laser technologies have been developed. Solutions suitable for Dense WDM (DWDM) applications and with high speed modulation performance at 10 Gigabit/second or above are typically desired.

Conventional or proposed WDM laser solutions include fixed wavelength externally modulated laser (EML), wavelength tunable lasers, externally seeded injection locked Fabry-Perot (FP) lasers, and reflective optical amplifier (RSOA) lasers.

Other conventional architectures can include self-seeding mechanisms in which drop fibers connecting the light sources to the passive distribution node serve as part of the laser cavity, and a partial reflector on the transmission side of the WDM multiplexer (MUX) at the passive node together with the WDM MUX serves as the wavelength selective mirror in the laser cavity to lock the laser wavelength to the channel defined by the WDM MUX. Though such architectures greatly simplify a passive optical network WDM (WDM-PON) system, it is nevertheless challenging to manage a long external cavity laser for stable and high performance transmission at high data rates and long distance.

SUMMARY

In general, one innovative aspect of the subject matter described in this specification can be embodied in optical assemblies that include a Fabry-Perot (FP) laser diode; a first polarization controller (PC) coupled to the FP laser diode; a circulator having four ports, a first port coupled to the first PC; an optical fiber coupled at a first end to a second port of the circulator; a second PC coupled to a third port of the circulator; an optical amplifier coupled to the second PC and a fourth port of the circulator; a wavelength division multiplexer (WDM) filter coupled to the second end of the optical fiber; a splitter having at least three ends coupled at a first end to the WDM; and a Faraday rotator mirror (FRM) coupled directly or indirectly to a second end of the splitter, wherein an optical signal output by the FP laser diode passes through the circulator, through the optical fiber, through the WDM filter, through the splitter, and onto the FRM or leaves the optical assembly as an output signal through a third end of the splitter; and wherein the optical signal reflected by the FRM then passes through the WDM filter, through the optical fiber, through the circulator, through the second PC such that the polarization of the optical output of the second PC is substantially matched with the polarization of the optical amplifier, through the optical amplifier, back through the circulator again, through the first PC such that the polarization of the optical output of the first PC is substantially matched with the polarization of the FP laser diode, and then injected back into the FP laser diode. Other embodiments of this aspect include corresponding methods.

The foregoing and other embodiments can each optionally include one or more of the following features, alone or in combination. The WDM filter is a dense wavelength division multiplexing filter. The optical amplifier is positioned between the third port and the fourth port of the circulator. The optical amplifier is a semiconductor optical amplifier. The semiconductor optical amplifier cancels a modulation of the optical signal that passes through the semiconductor optical amplifier.

In general, one innovative aspect of the subject matter described in this specification can be embodied in optical assemblies that include a Fabry-Perot (FP) laser diode; a reflective semiconductor optical amplifier (RSOA); a first polarization controller (PC) coupled to an optical output of the FP laser diode; a circulator having four ports, a first port coupled to an optical output of the RSOA and a second port coupled to an optical output of the first PC; a second PC coupled to a third port of the circulator; a third PC coupled to a fourth port of the circulator; a polarization beam splitter (PBS) coupled on a first end to the second PC and coupled on a second end to the third PC; an optical fiber coupled at a first end to a third end of the PBS; a wavelength division multiplexer (WDM) filter coupled to the second end of the optical fiber; a splitter having at least three ends coupled at a first end to the WDM; and a Faraday rotator mirror (FRM) coupled directly or indirectly to a second end of the splitter, wherein an optical signal output by the FP laser diode passes through the circulator, through the second PC such that optical signal entering the PBS after leaving the second PC is substantially matched with the polarization of the PBS, through the PBS, through the optical fiber, through the WDM filter, through the splitter, and onto the FRM or leaves the optical assembly as an output signal through a third end of the splitter; and wherein the optical signal reflected by the FRM passes through the WDM filter, through the optical fiber, through the PBS, through the third PC such that the polarization of the output signal of the third PC is substantially matched with the polarization of the RSOA, enters the circulator through the fourth port and out of the first port into the RSOA, is reflected back into the circulator through the first port, and exits the circulator through the second port, through the first PC such that the polarization of the output signal is substantially matched with the FP laser diode, and is injected back into the FP laser diode. Other embodiments of this aspect include corresponding methods.

The foregoing and other embodiments can each optionally include one or more of the following features, alone or in combination. The WDM filter is a dense wavelength division multiplexing filter. The optical amplifier is a reflective semiconductor optical amplifier. The reflective semiconductor optical amplifier cancels a modulation of the optical signal that passes through the reflective semiconductor optical amplifier.

In general, one innovative aspect of the subject matter described in this specification can be embodied in optical assemblies that include a Fabry-Perot (FP) laser diode; a first splitter coupled to receive an optical signal from FP laser diode and separate the optical signal into two output optical signals; a first photodiode coupled to receive a first output optical signal from the first splitter; a polarization beam splitter (PBS) coupled to receive a second optical signal from the first splitter; an optical fiber coupled at a first end to receive a first optical output from the PBS; a wavelength division multiplexer (WDM) filter coupled to receive the optical output from a second end of the optical fiber; a second splitter coupled to receive the optical signal from the WDM filter and separates the optical signal into at least two output optical signals; a Faraday rotator mirror (FRM) coupled directly or indirectly to a first output of the second splitter; a third splitter coupled to receive the optical signal from a second optical output from the PBS; a second photodiode coupled to receive a first output optical signal from the third splitter; a half wave plate coupled to receive a second output optical signal from the third splitter; an optical amplifier coupled on a first end to receive the output optical signal from the half wave plate and coupled on a second end to transmit an optical signal to the FP laser diode, wherein the FRM reflects the optical signal back to the PBS such that the reflected optical signal has a polarization that is rotated by substantially 90 degrees relative to the optical signal received by the FRM, wherein the reflected optical signal is separated by the PBS from a forward going optical signal outputted from the FP laser diode, wherein the reflected optical signal is then outputted to the third splitter such that part of the reflected optical signal is sent to the second photodiode to be monitored, and wherein the forward going optical signal is outputted to the first splitter such that part of the forward going optical signal is sent to the first photodiode to be monitored. Other embodiments of this aspect include corresponding methods.

The foregoing and other embodiments can each optionally include one or more of the following features, alone or in combination. The half wave plate rotates the polarization of the reflected optical signal by substantially 90 degrees. The WDM filter is a dense wavelength division multiplexing filter. The optical amplifier is a semiconductor optical amplifier.

In general, one innovative aspect of the subject matter described in this specification can be embodied in optical assemblies that include a Fabry-Perot (FP) laser diode; a first collimating lens coupled to an optical output end of the FP laser diode; a polarization beam splitter (PBS) coupled at a first end to receive the collimated optical signal with matched polarization from the first lens; a second collimating lens coupled to the optical output from a first end of the PBS and to focus the optical output into a first end of an optical fiber positioned at a second end of the second collimating lens; a first mirror coupled to receive an optical output from the PBS; a half wave plate coupled to receive an optical output from the first mirror; a second mirror coupled to receive an optical output from the half wave plate; a third mirror coupled to receive an optical output from the second mirror; a third collimating lens coupled to receive an optical output from the third mirror; an optical amplifier coupled on a first end to receive an focused optical output from the third collimating lens and configured to output from a second end an optical signal to the FP laser diode, wherein an optical input received at the second collimating lens from the optical fiber is a reflected optical signal from the FP laser diode that passes through the second collimating lens, has a polarization such that it is reflected by the PBS by substantially 90 degrees, is folded by substantially 90 degrees by the first mirror, passes through the half wave plate such that the signal is rotated to match the polarization of the optical amplifier, is folded by the second mirror by substantially 90 degrees, is further folded by the third mirror by substantially 90 degrees, passes through the third collimating lens, passes through the optical amplifier, and then is injected into the rear facet of the FP laser diode. Other embodiments of this aspect include corresponding methods.

The foregoing and other embodiments can each optionally include one or more of the following features, alone or in combination. The optical assembly further includes a wavelength division multiplexer (WDM) filter coupled to receive the optical output from a second end of the optical fiber; and a Faraday rotator mirror (FRM) coupled directly or indirectly to an output end of the WDM, wherein an output optical signal of the WDM filter is partially reflected by the FRM such that the polarization of a reflected beam is rotated by substantially 90 degrees after transmission through and reflection by the FRM, and wherein the reflected optical signal passes through the WDM filter. The WDM filter is a dense wavelength division multiplexing filter. The optical amplifier is a semiconductor optical amplifier. The semiconductor optical amplifier cancels a modulation of the optical signal that passes through the semiconductor optical amplifier. The optical assembly further includes an optical isolator optically coupled to the PBS and the optical amplifier such that an enabling beam direction of the optical isolator points to the first end of the optical amplifier. The optical assembly further includes a steering lens optically coupled to the PBS and the third collimating lens. The first mirror is coated with partial transmission reflection film such that an optical signal from the PBS can be partially transmitted through it, the optical assembly further includes: a first integrated photodiode and mirror device configured to receive and focus the partially transmitted optical signal from the first mirror; a beam splitter coupled on a receiving end to the first lens and on an output end to the PBS such that an optical signal from the FP laser diode is partially reflected; and a second integrated photodiode and mirror device configured to receive and focus the partially reflected optical signal from the beam splitter. The optical assembly further includes a wire bonding connecting the anode and cathode bonding pad of each photodiode. All the components of the optical assembly are placed on top of a substrate. The substrate is formed from silicon or ceramic. The optical assembly further includes a C/L band filter coupled on a first end to the PBS; and a receiver module coupled to a second end of the C/L band filter, wherein the C/L band filter is configured to separate an incoming optical signal into a C-band wavelength output signal and a L-band wavelength signal such that a first output signal follows the previous optical path while a second output signal is reflected. The C/L band filter separates an incoming L-band signal from the PBS such that a L-band signal is reflected onto the receiver while a C-band signal transmits through the C/L band filter into the WDM. All the components of the optical assembly are placed on top of a substrate. The substrate is formed from of silicon or ceramic. The optical assembly is placed in a thermoelectric (TEC) cooler. The optical assembly is contained in a package case with lead pins located on two sides of the package case such that a modulation current going into the FP laser diode or a received AC signal output from the receiver can exit the package case.

In general, one innovative aspect of the subject matter described in this specification can be embodied in an apparatus that include a Fabray-Perot laser diode assembly coupled to a first port of a circulator; an optical amplifier coupled to a second port of the circulator; a wavelength division multiplexer (WDM) filter coupled to a third port of the circulator; and a Faraday rotator mirror coupled to the WDM filter.

Particular embodiments of the subject matter described in this specification can be implemented so as to realize one or more of the following advantages. FP lasers, directly or externally modulated, are used as the light source to improve the basic laser characteristics including RIN noise quality, spectral quality, and modulation speed performance compared to a semiconductor optical amplifier. Additionally, the architectures described in the specification improve the stability of the laser and its performance over prior architectures.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes WDM laser architectures based on an external cavity Fabry-Perot (FP) laser diode. Additionally, this specification describes implementations of the WDM laser architectures in a small form factor transceiver. The transceiver can be configured to operate at up to 10 Gigabits per second (Gbit/s) to provide a so-called "colorless enhanced small form-factor pluggable (SFP+)" transceiver. A small form-factor pluggable (SFP) is a compact, hot-pluggable transceiver used for both telecommunication and data communications applications. SFP+ is an enhanced version of the SFP that supports data rates up to 10 Gbit/s.

Figure 1A:
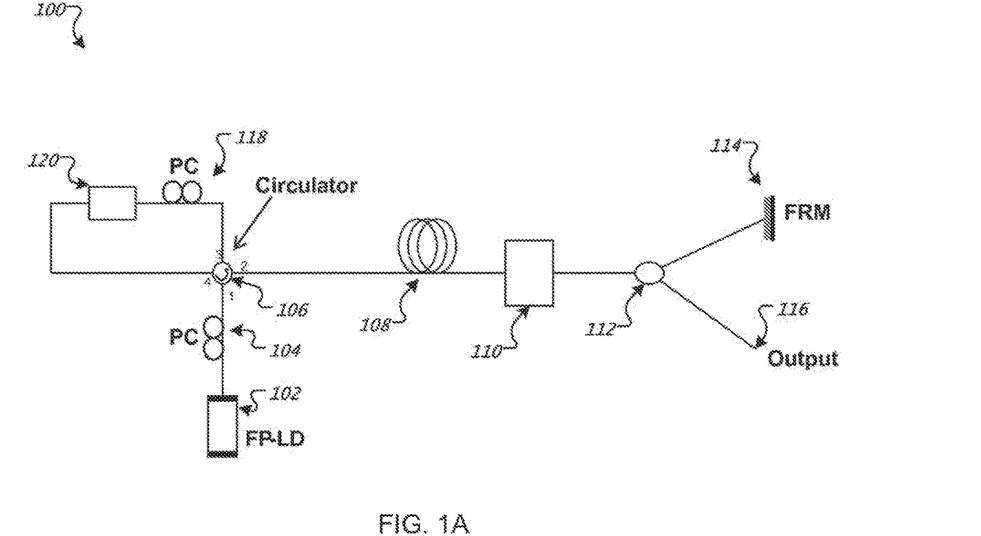
FIGS. 1A and 1B show examples of an external cavity coupled FP laser structure with a circulator and an optical amplifier in between the FP laser and a DWDM filter.
Figure 1B:
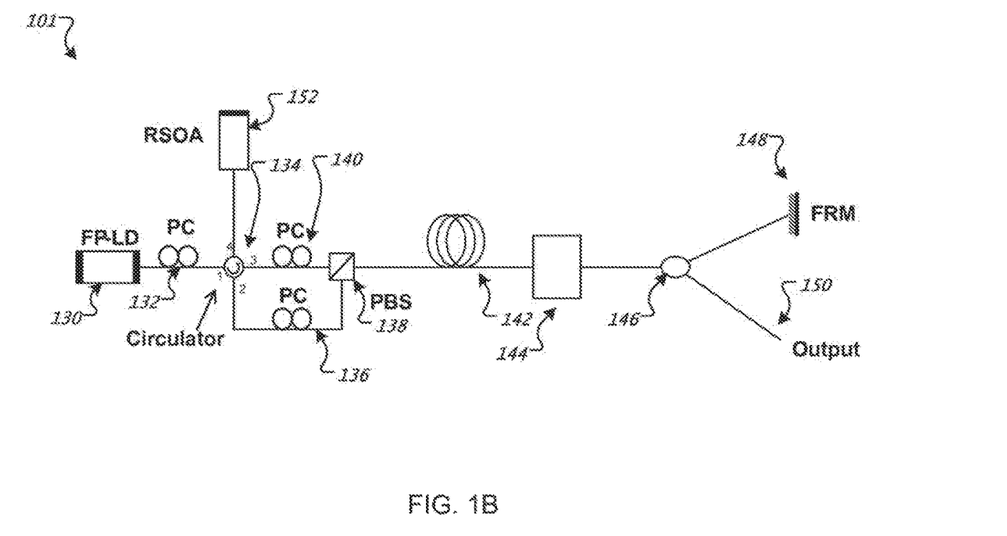

FIGS. 1A and 1B show examples of an external cavity coupled FP laser structure with a circulator and an optical amplifier in between the FP laser and a DWDM filter.

In particular, FIG. 1A shows a FP laser structure 100. The FP laser structure 100 includes an FP laser diode 102. The FP laser diode 102 is a particular type of laser diode. A laser diode is an electrically pumped semiconductor laser. In the FP laser diode, a gain region is surrounded with an optical cavity to form a laser. In the simplest form of a laser diode, an optical waveguide is made on a crystal surface, such that the light is confined to a relatively narrow line. The two ends of the crystal are cleaved to form parallel edges, providing a Fabry—Pérot resonator. Photons emitted into the waveguide will travel along the waveguide and be reflected several times from each end face before they are emitted. As a light wave passes through the cavity, it is amplified by stimulated emission, but light is also lost due to absorption and by incomplete reflection from the end facets. If there is more amplification than loss, the diode begins to "lase."

The FP laser diode 102 is coupled to a first polarization controller (PC) 104, which is coupled to a circulator 106. Thus, the first PC 104 is positioned between the FP laser diode 102 and the circulator 106. The polarization controller 104 is an optical device configured to modify the polarization state of received optical signals.

The circulator 106 is a four port optical circulator such that light signals entering the first port exit a second port; light signals entering the second port exit a third port; and light signals entering the third port exit the fourth port, etc. The first port of the circulator 106 is coupled to the first PC 104.

The second port of the circulator 106 is coupled to a first end of an optical fiber 108. A second end of the optical fiber 108 is coupled to a WDM filter 110. The WDM filter 110 can be a DWDM filter. A WDM filter is configured to pass particular bands of wavelengths while blocking others. Thus, an optical signal can be configured to transmit signals having particular wavelengths without passing other wavelengths.

The WDM filter 110 is coupled to a splitter 112, which separates incoming light into two paths. A first path from the splitter 112 is coupled to a Faraday rotator mirror (FRM) 114 and the second path from the splitter 112 is couple to an output port 116. A FRM is an optical device that rotates the polarization of incident light signals based on an applied magnetic field and then reflects the light having the rotated polarization.

A third port of the circulator 106 is coupled to a second PC 118. The second PC 118 is coupled to an optical amplifier 120. The optical amplifier 120 can be a semiconductor optical amplifier (SOA). Semiconductor optical amplifiers are amplifiers that use a semiconductor to provide a gain medium. An output of the optical amplifier 120 is coupled to a fourth port of the circulator 106 forming a loop between the third port and the fourth port of the circulator 106.

In operation, an optical signal output by the FP laser diode 102 enters the first port of the circulator 106 and is output into the optical fiber 108. The optical signal then passes through the WDM filter 110 to the splitter 112. The splitter 112 splits the optical signal such that a portion of the optical signal passes to the output port 116 and another portion of the optical signal is directed to the FRM 114. The optical signal reflected by the FRM 114, which becomes a feedback signal, passes back through the WDM filter 110 and optical fiber 108 to the second port of the circulator 106.

The optical signal is output at the third port of the circulator 106 and passes through the second PC 118 to the optical amplifier 120. The optical signal passes through the second PC 118 such that the polarization of the optical output of the second PC 118 is substantially matched with the polarization of the optical amplifier 120. In some implementations, the optical amplifier 120 is configured to cancel a modulation of the optical signal passing through it. From the optical amplifier 120, the, now amplified, optical signal enters the fourth port of the circulator 106 and exits at the first port of the circulator 106. From the circulator 106, the optical signal passes through the first PC 104 such that the polarization of the optical signal output from the first PC 104 is substantially matched with the polarization of the FP laser diode 102. The optical signal exiting the first PC 104 is injected back into the FP laser.

FIG. 1B shows FP laser structure 101. The FP laser structure 101 includes an FP laser diode 130. The FP laser diode 130 is coupled to a first polarization controller (PC) 132, which is coupled to a circulator 134. Thus, the first PC 132 is positioned between the FP laser diode 130 and the circulator 134.

The circulator 134 is a four port optical circulator, e.g., similar to circulator 106 of FIG. 1A. The first port of the circulator 134 is coupled to the first PC 132. The second port of the circulator 134 is coupled to a second PC 136. The second PC 136 is further coupled to a polarization beam splitter (PBS) 138.

A third port of the circulator 134 is coupled to a third PC 140. The third PC 140 is coupled to the PBS 138. The PBS 138 is coupled to a first end of an optical fiber 142. A second end of the optical fiber 142 is coupled to a WDM filter 144. The WDM filter 144 can be a DWDM filter.

The WDM filter 144 is coupled to a splitter 146 which separates incoming light into two paths. A first path from the splitter 146 is coupled to a Faraday rotator mirror (FRM) 148 and a second path from the splitter 146 is coupled to an output port 150.

A fourth port of the circulator 134 is coupled to an optical amplifier 152. The optical amplifier 152 can be a reflective optical amplifier (RSOA).

In operation, an optical signal output by the FP laser diode 130 enters the first port of the circulator 134 and is output from the second port of the circulator 134. The optical signal passes through the second PC 136 to the PBS 138. The polarization of the optical signal exiting the second PC 136 is substantially matched with the polarization of the PBS 138. The optical signal passes through the PBS 138 and into the optical fiber 142 to the WDM filter 144. The optical signal passes through the WDM filter 144 to the splitter 146.

The splitter 146 splits the optical signal such that a portion of the optical signal passes to the output port 150 and another portion of the optical signal is directed to the FRM 148. The optical signal reflected by the FRM 148, which becomes a feedback signal, passes back through the WDM filter 144 and optical fiber 142 to the PBS 138. The optical signal passes through the PBS 138 and the third PC 140 to the third port of the circulator 134. The optical signal output through the third PC 140 has a polarization that is substantially matched with the polarization of the optical amplifier 152.

The optical signal exits the fourth port of the circulator 134 and into the optical amplifier 152. In some implementations, the optical amplifier 120 is configured to cancel a modulation of the optical signal passing through it. The amplified optical signal is output from the optical amplifier 152 and enters the fourth port of the circulator 132. In particular, when the optical amplifier 152 is a RSOA, the optical signal is reflected back out of the optical amplifier 152 as an amplified optical signal. The amplified optical signal exits the first port of the circulator 132 and passes through the first PC 132 such that the polarization of the output amplified optical signal is substantially matched with the FP laser diode 130. The amplified optical signal is then injected back into the FP laser diode 130.

Figure 2:
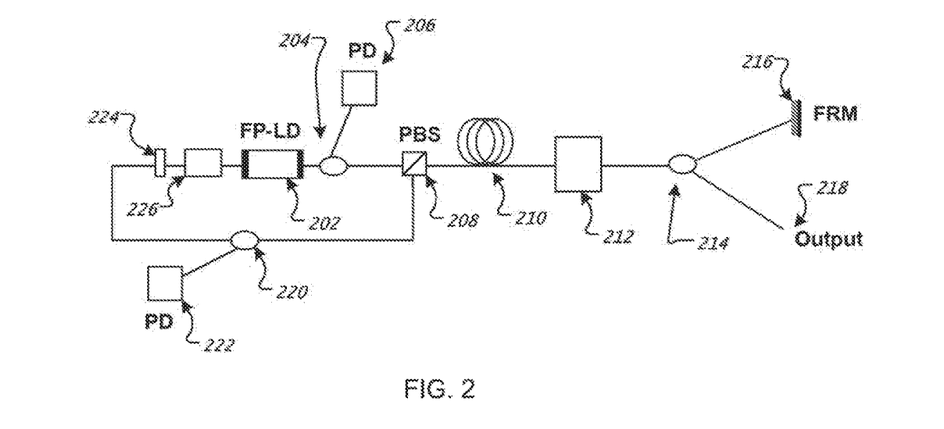
FIG. 2 shows an example of an external cavity coupled FP laser structure with an FP laser positioned between a polarization beam splitter (PBS) and an optical amplifier.

FIG. 2 shows an example of an external cavity coupled FP laser structure 200 with an FP laser positioned between a polarization beam splitter (PBS) and an optical amplifier.

The FP laser structure 200 includes an FP laser diode 202. The FP laser diode 202 is coupled to a first splitter 204. The first splitter 204 separates an incoming optical signal from the FP laser diode 202 into two output optical paths. The first optical path from the splitter 204 is coupled to a first photodiode 206. The second optical path from the splitter 204 is coupled to a PBS 208.

An output of the PBS 208 is coupled to a first end of an optical fiber 210. A second end of the optical fiber 210 is coupled to a WDM filter 212. The WDM filter 212 can be a DWDM filter. The WDM filter 212 is coupled to a second splitter 214, where a first path from the splitter 214 is coupled to a Faraday rotator mirror (FRM) 216 and the second path from the splitter 214 is coupled to an output port 218.

The PBS 208 includes a second optical output coupled to a third splitter 220. A second photodiode 222 is coupled to a first output path of the third splitter 220. A half wave plate 224 is coupled to a second output path of the third splitter 220. An optical amplifier 222, e.g., an SOA, is coupled between the half wave plate 220 and a rear facet of the FP laser diode 202.

In operation, an optical signal output by the FP laser diode 202 enters splitter 204 where it is separated into two output optical signals. One output optical signal is routed to the first photodiode 206 for power monitoring. This first photodiode 206 monitors the signal power emitted by the FP laser diode 202. The second output optical signal is routed to the PBS 208.

The optical signal passes through the PBS 208 and into the optical fiber 210 to the WDM filter 212. The optical signal passes through the WDM filter 212 to the splitter 214. The splitter 214 splits the optical signal such that a portion of the optical signal passes to the output port 218 and another portion of the optical signal is directed to the FRM 216. The optical signal reflected by the FRM 216, which becomes a feedback signal, passes back through the WDM filter 212 and optical fiber 210 to the PBS 208. The FRM 216 reflects the optical signal back to the PBS 208 such that the optical signal reflected by the FRM 216 has a polarization that is rotated by substantially 90 degrees relative to the optical signal received by the FRM 216. Because of the rotation of polarization, the optical signal is directed to the second optical output port of the PBS 208. The FP laser structure 200 takes advantage of the fact that the reflected optical signal from the FRM 216 has an orthogonal polarization to the incoming optical signal.

The optical signal exits the second optical output of the PBS 208 and enters the third splitter 220. The third splitter 220 separates the optical signal into two output optical signals. One output optical signal is routed to the second photodiode 222 for power monitoring. In particular, the second photodiode 222 monitors the feedback signal power. The monitored power can be compared with the signal power monitored by the first photodiode 206 to measure a cavity loss of the external cavity, which can be used to align the FP laser diode 202 for optimum performance.

The second output optical signal is routed to the half wave plate 224. The half wave plate 224 rotates the polarization of the optical signal by substantially 90 degrees relative to the optical signal received by the half wave plate 224 such that the optical signal is substantially matched with the polarization of the optical amplifier 226. The optical signal exits the half wave plate 224 and passes into the optical amplifier 226. In some implementations, the optical amplifier 226 is configured to cancel a modulation of the optical signal before coupling the amplified optical signal into a rear facet of the FP laser diode 202. The optical amplifier 226 can be a SOA. The amplified optical signal is output from the optical amplifier 226 and enters the rear facet of the FP laser diode 202, which locks the FP laser's lasing wavelength. The FP laser structure 200 eliminates the use of an optical circulator and provides for the implementation of a compact transmitter optical subassembly for building SFP+ transceivers.

Figure 3:
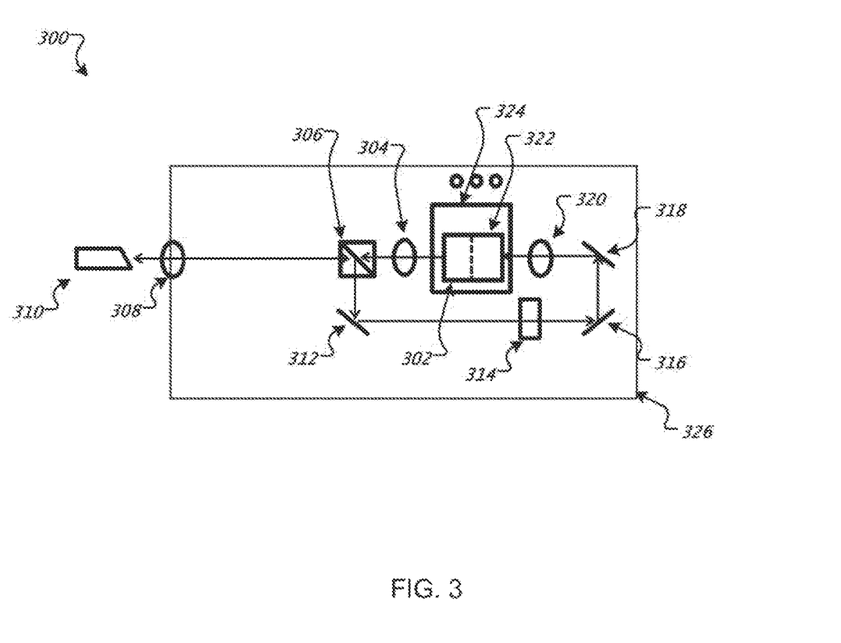
FIG. 3 shows an example of a compact WDM laser transmitter optical subassembly (TOSA).

FIG. 3 shows an example of a compact WDM laser transmitter optical subassembly (TOSA) 300. The TOSA 300 can provide an integrated, monolithically or as a hybrid, and mutually coupled FP+SOA device used as a light source with the FP laser being directly modulated for data transmission while the SOA is used to amplify and cancel modulation of a self-seeding feedback signal.

The TOSA 300 includes an FP laser diode 302. An optical output end of the FP laser diode 302 is coupled to a first collimating lens 304. The first collimating lens 304 is coupled to a PBS 306 such that the first collimating lens 304 is positioned between the PBS 306 and the FP laser diode 302. The PBS 306 has a first output that is coupled to a second collimating lens 308, which passes collimated light to a fiber 310, e.g., through a receptacle assembly. This fiber 310 can be coupled to a WDM filter and FRM assembly, not shown, for example as described above with respect to FIGS. 1 and 2, and can return a feedback signal.

A second optical output of the PBS 306 is coupled to a first mirror 312. The first mirror 312 is also coupled to a half wave plate 314 such that the first mirror 312 is positioned between the PBS 306 and the half wave plate 314. The half wave plate is coupled to a second mirror 316, which is coupled to a third mirror 318. The third mirror is coupled to a third collimating lens 320.

The third collimating lens 320 is coupled to an optical amplifier 322. The optical amplifier 322 can be an SOA. The optical amplifier 322 is configured to receive a focused optical signal from the third collimating lens 320 and output an amplified optical signal to the FP laser diode 302. The FP laser diode 302 and the optical amplifier 322 can be positioned together on a submount 324.

Furthermore, the components of the TOSA 300 can be placed an aligned on a substrate and positioned within a package case 326 for providing a compact optical module. The substrate can be silicon or ceramic. The substrate can be used as a carrier to have precise dimension control and alignment features, e.g., alignment marks or fillister for passive alignment of optical components. As a result, optical component alignment and repair can be performed more easily.

In operation, an optical signal output by the FP laser diode 302 enters the first collimating lens 304. The resulting collimated light, having a matched polarization, passes through the PBS 306. The output light from the first output of the PBS 306 passes through the second collimating lens 310 and exits the package 326 and into the optical fiber 310.

A feedback optical signal is returned from the optical fiber 310. The feedback optical signal can be provided from, for example, a FRM as described above with respect to FIGS. 1 and 2. The feedback optical signal is rotated to be orthogonal to the outgoing light of the FP laser diode 302. Consequently, after being collimated by the second lens 308, the feedback optical signal is reflected by the PBS 306 because of the polarization and exits the second output of the PBS 306. The exiting feedback optical signal is incident on the first mirror 312, half wave plate 314, second mirror 316, and third mirror 318. To provide a compact TOSA, each mirror folds the feedback optical signal by 90 degrees. The half wave plate 314 rotates the feedback optical signal such that the polarization matches the optical amplifier 322. After being reflected by the third mirror 318, the feedback optical signal passes through third collimating lens 320 and then into a rear facet of the optical amplifier 322. The optical amplifier 322 amplified the feedback optical signal and couples it back into the rear facet of the FP laser diode 302 to lock the lasing wavelength of the FP laser diode 302.

Figure 4:
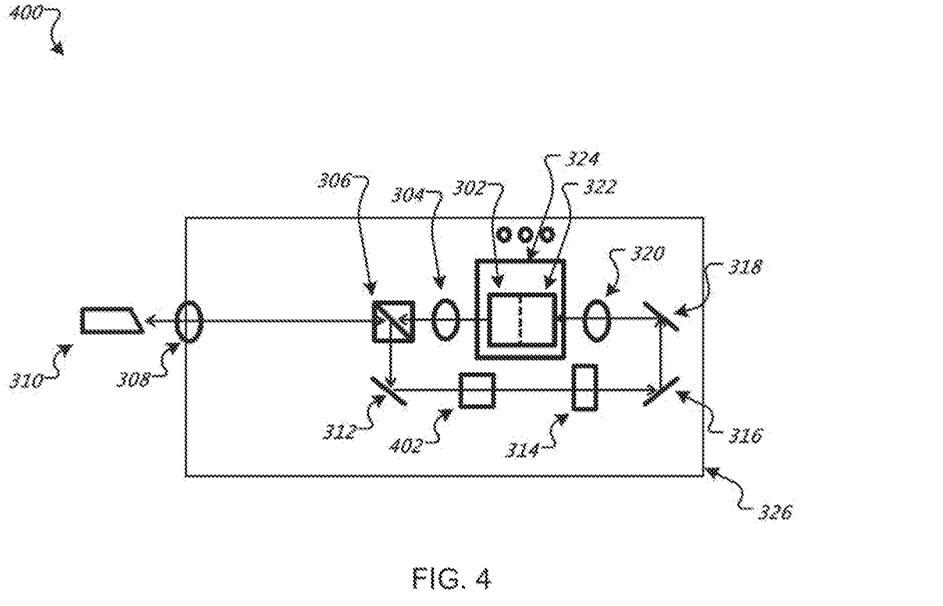
FIG. 4 shows an example of a compact WDM laser transmitter optical subassembly (TOSA) with an isolator.

FIG. 4 shows an example of a compact WDM laser transmitter optical subassembly (TOSA) 400 with an isolator 402. The TOSA 400 provides an integrated, monolithically or as a hybrid, and mutually coupled FP+SOA device used as a light source with the FP laser being directly modulated for data transmission while the SOA is used to amplify and cancel modulation of a self-seeding feedback signal.

The TOSA 400 includes the FP laser diode 302. An optical output end of the FP laser diode 302 is coupled to the first collimating lens 304. The first collimating lens 304 is coupled to the PBS 306 such that the first collimating lens 304 is positioned between the PBS 306 and the FP laser diode 302. The PBS 306 has a first output that is coupled to the second collimating lens 308, which passes collimated light to the fiber 310, e.g., through a receptacle assembly. This fiber 310 can be coupled to a WDM filter and FRM assembly, not shown, for example as described above with respect to FIGS. 1 and 2.

The second optical output of the PBS 306 is coupled to the first mirror 312. The first mirror 312 is also coupled to the isolator 402 such that the first mirror 312 is positioned between the PBS 306 and the isolator 402. The isolator 402 is coupled to the half wave plate 314. The half wave plate is coupled to the second mirror 316, which is coupled to the third mirror 318. The third mirror is coupled to the third collimating lens 320.

The third collimating lens 320 is coupled to the optical amplifier 322. The optical amplifier 322 can be an SOA. The optical amplifier 322 is configured to receive a focused optical signal from the third collimating lens 320 and output an amplified optical signal to the FP laser diode 302. The FP laser diode 302 and the optical amplifier 322 can be positioned together on submount 324.

Furthermore, the components of the TOSA 400 can be placed an aligned on a substrate and positioned within a package case 326 for providing a compact optical module. The substrate can be silicon or ceramic. The substrate can be used as a carrier to have precise dimension control and alignment features, e.g., alignment marks or fillister for passive alignment of optical components. As a result, optical component alignment and repair can be performed more easily.

In operation, an optical signal output by the FP laser diode 302 enters the first collimating lens 304. The resulting collimated light, having a matched polarization, passes through the PBS 306. The output light from the first output of the PBS 306 passes through the second collimating lens 310 and exits the package 326 and into optical fiber 310.

A feedback optical signal is returned from the optical fiber 310. The feedback optical signal can be provided from a FRM as described above with respect to FIGS. 1 and 2. The feedback optical signal is rotated to be orthogonal to the outgoing light of the FP laser diode 302. Consequently, after being collimated by the second lens 308, the feedback optical signal is reflected by the PBS 306. The exiting feedback optical signal is incident on the first mirror 312, isolator 402, half wave plate 314, second mirror 316, and third mirror 318.

To provide a compact TOSA, each mirror folds the feedback optical signal by 90 degrees. The half wave plate rotates the feedback optical signal such that the polarization matches the optical amplifier 322. After being reflected by the third mirror 318, the feedback optical signal passes through the third collimating lens 320 and then into a rear facet of the optical amplifier 322. The optical amplifier 322 amplified the feedback optical signal and couples it back into the FP laser diode 302 through its rear facet to lock the lasing wavelength of the FP laser diode 302. The isolator 402 is used to block any reflected optical signals in the opposite direction, for example, light emitted from the rear facet of the optical amplifier 322. In some alternative implementations, the isolator 402 can be positioned at any point in the optical path between the PBS 306 and the rear facet of the optical amplifier 322.

Figure 5:
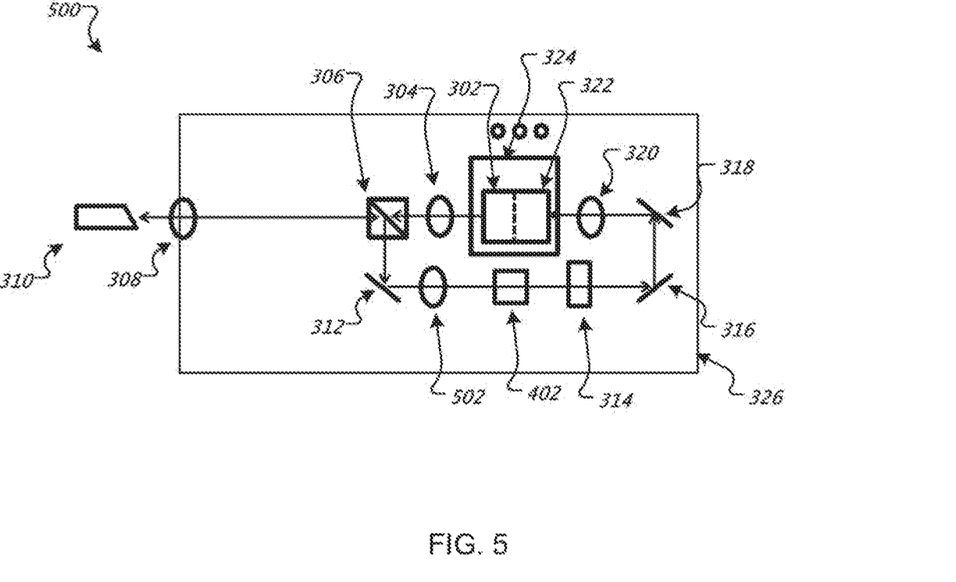
FIG. 5 shows an example of a compact WDM laser transmitter optical subassembly (TOSA) with a steering lens.

FIG. 5 shows an example of a compact WDM laser transmitter optical subassembly (TOSA) 500 with a steering lens 502. The TOSA 500 provides an integrated, monolithically or as a hybrid, and mutually coupled FP+SOA device used as a light source with the FP laser being directly modulated for data transmission while the SOA is used to amplify and cancel modulation of a self-seeding feedback signal.

In particular, the TOSA 500 includes the same structure as the TOSA 400 of FIG. 4 with the addition of the steering lens 502. The steering lens 502 is positioned between the first mirror 312 and the isolator 402. While the steering lens 502 is shown in this position, in alternative implementations the steering lens can be positioned at any suitable location in the optical path between the PBS 306 and the third collimating lens 320. The steering lens 502 is positioned in the feedback path to improve backward light coupling to the optical amplifier 322 by correcting possible beam shifting and tilting induced by assembly misalignment of optical components. The steering lens 502 can also increase the tolerance of alignment in coupling the light into the optical amplifier 322.

Figure 6:
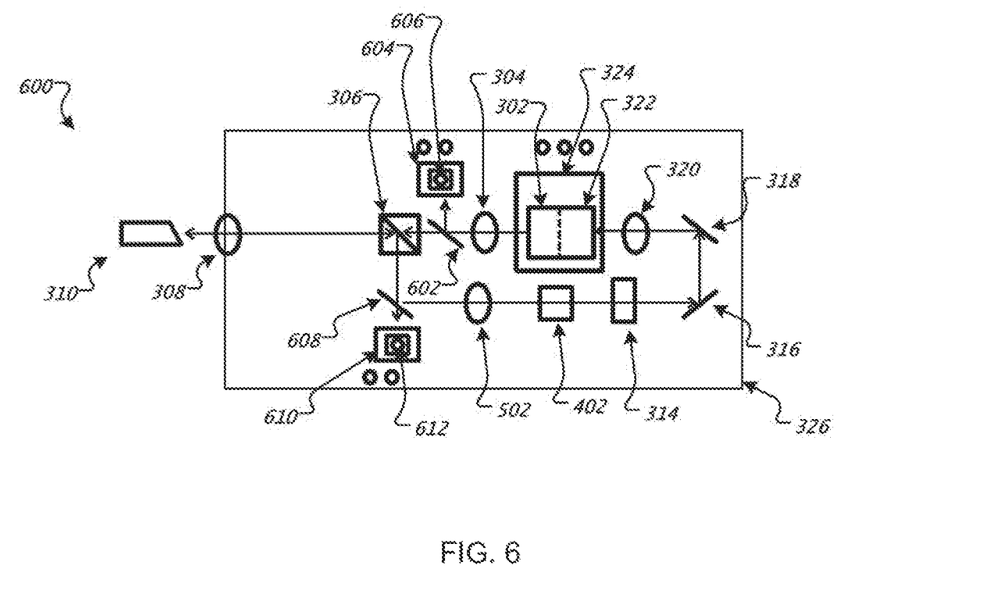
FIG. 6 shows an example of a compact WDM laser transmitter optical subassembly (TOSA) with monitoring photodiodes.

FIG. 6 shows an example of a compact WDM laser transmitter optical subassembly (TOSA) 600 with monitoring photodiodes.

The TOSA 600 includes the FP laser diode 302. An optical output end of the FP laser diode 302 is coupled to the first collimating lens 304. The first collimating lens 304 is coupled to a beam splitter 602. The beam splitter 602 can have a partial reflection coating that reflects a portion of an incident light along a first output path and passing a portion of the incident light along a second output path. The beam splitter 602 is coupled on the first output path to a first photodiode 606 having an integrated mirror lens 604. The mirror lens 604 reflects and focuses light on the first photodiode 606. The photodiode 606 can include a bonding pad that is wire bonded to a lead pin along the package case 326 to provide for power monitoring electric signal access.

The beam splitter 602 is coupled on the second output path to the PBS 306 such that the beam splitter 602 is positioned between the PBS 306 and the first collimating lens 304. The PBS 306 has a first output that is coupled to the second collimating lens 308, which passes collimated light to the fiber 310, e.g., through a receptacle assembly. This fiber 310 can be coupled to a WDM filter and FRM assembly, not shown, for example as described above with respect to FIGS. 1 and 2.

A second optical output of the PBS 306 is coupled to a first mirror 608. The first mirror 608 is a partial transmission mirror instead of a full reflection mirror. The first mirror 608 is optically coupled, along a transmission path, to a second photodiode 612 integrated with a mirror lens 610. The mirror lens 610 reflects and focuses light on the second photodiode 612. The second photodiode 612 is used for power monitoring of the feedback signal.

The first mirror 608 is also coupled, along a reflection path, to the steering lens 502. The steering lens 502 is coupled to the isolator 402 such that the steering lens 502 is positioned between the first mirror 608 and the isolator 402. The isolator 402 is coupled to the half wave plate 314. The half wave plate is coupled to the second mirror 316, which is coupled to the third mirror 318. The third mirror is coupled to the third collimating lens 320. In some other implementations, the isolator and the steering lens can be positioned in other locations on the feedback loop as described above.

The third collimating lens 320 is coupled to the optical amplifier 322. The optical amplifier 322 can be an SOA. The optical amplifier 322 is configured to receive a focused optical signal from the third collimating lens 320 and output an amplified optical signal to the FP laser diode 302. The FP laser diode 302 and the optical amplifier 322 can be positioned together on a submount 324.

The TOSA 600 operates in a similar manner as described above. However, the beam splitter 602 causes a portion of the output optical signal from the FP laser diode 302 to be passed to the first photodiode 606 for power monitoring. Similarly, the first mirror 608 causes a portion of the feedback optical signal to be passed to the second photodiode 612 for power monitoring.

Figure 7:
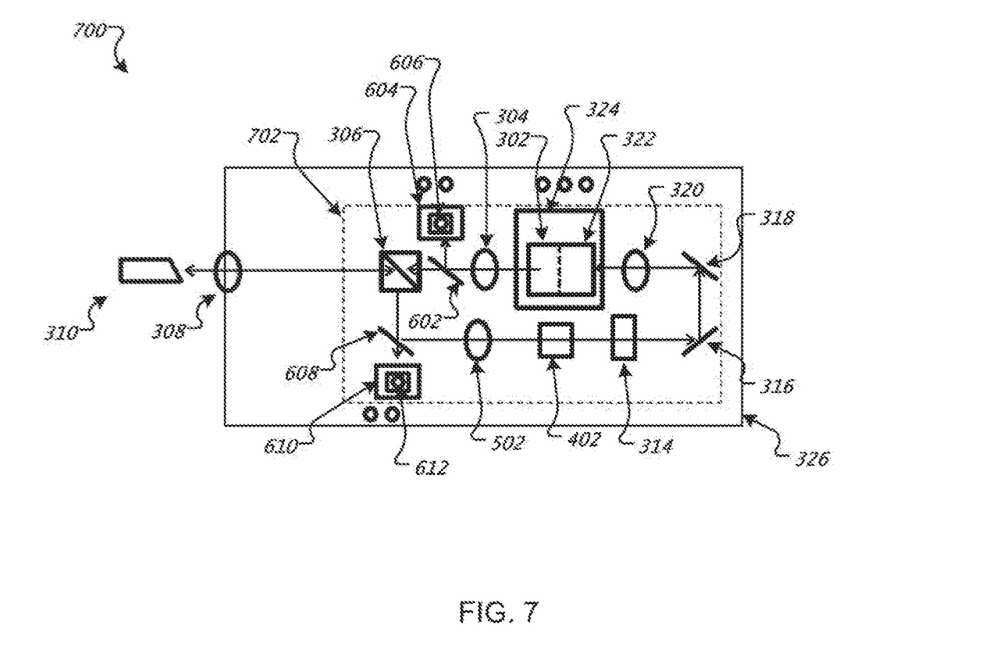
FIG. 7 shows an example of a compact WDM laser transmitter optical subassembly (TOSA) with optical system placed and aligned on a carrier.

FIG. 7 shows an example of a compact WDM laser transmitter optical subassembly (TOSA) 700 with optical system placed and aligned on a carrier. In particular, the TOSA 700 is shown as including the components of TOSA 600 described above with respect to FIG. 6 and operates in a similar manner. However, a number of the optical components within the package case 326 can be placed and aligned on a substrate 702. The substrate 702 can be formed from a suitable material including silicon or ceramic. The substrate 702 can be configured to have precise dimension control and alignment indicators such as one or more alignment marks or fillisters. These can be used for passive alignment of optical components arranged on the substrate 702.

Figure 8:
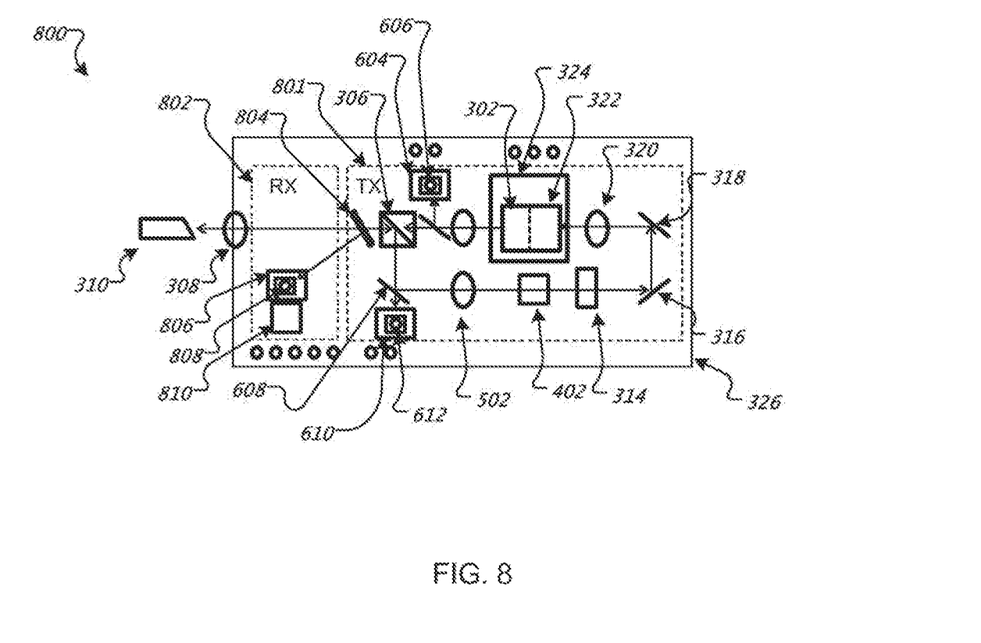
FIG. 8 shows an example of a compact bidirectional WDM optical module.

FIG. 8 shows an example of a compact bidirectional WDM optical module 800. The WDM optical module 800 can transmit and receive WDM optical signals through a single optical fiber.

The WDM optical module 800 includes a transmitter portion 801 and a receiver portion 802. The transmitter portion 801 includes components similar to those of TOSA 600. In particular, the transmitter portion of the WDM optical module 800 includes the FP laser diode 302. An optical output end of the FP laser diode 302 is coupled to the first collimating lens 304. The first collimating lens 304 is coupled to the beam splitter 602. The beam splitter 602 can have a partial reflection coating that reflects a portion of an incident light along a first output path and passing a portion of the incident light along a second output path. The beam splitter 602 is coupled on the first output path to the first photodiode 606 having an integrated mirror lens 604. The mirror lens 604 reflects and focuses light on the first photodiode 606. The first photodiode 606 can include a bonding pad that is wire bonded to a lead pin along the package case 326 to provide for power monitoring electric signal access.

The beam splitter 602 is coupled on the second output path to the PBS 306 such that the beam splitter 602 is positioned between the PBS 306 and the first collimating lens 304. The PBS 306 has a first output that is coupled to a C/L band filter 804. The C/L band filter 804 is coupled to the second collimating lens 308, which passes collimated light to the fiber 310, e.g., through a receptacle assembly. This fiber 310 can be coupled to a WDM filter and FRM assembly, not shown, for example as described above with respect to FIGS. 1 and 2.

The C/L band filter 804 is also coupled to the receiver portion 802. In particular, the C/L band filter 804 is coupled to a third photodiode 808 integrated with a mirror lens 806. The third photodiode 808 and mirror lens 806 can be positioned on a receiver substrate delineating the receiver portion 802. The mirror lens 806 is used to reflect and focus the collimating light reflected from the C/L band filter 804 onto the third photodiode 808. The photodiode 808 is coupled to a transimpedance amplify (TIA) integrated circuit 810. The TIA IC 810 can be used, for example, to provide wideband and low noise pre-amplification of signal current from the photodiode 808.

Referring back to the transmitter portion 801, the second optical output of the PBS 306 is coupled to the first mirror 608. The first mirror 608 is a partial transmission mirror instead of a full reflection film. The first mirror 608 is optically coupled, along a transmission path, to the second photodiode 612 integrated with the mirror lens 610. The mirror lens 610 reflects and focuses light on the second photodiode 612. The second photodiode 612 is used for power monitoring of the feedback signal.

The first mirror 608 is also coupled, along a reflection path, to the steering lens 502. The steering lens 502 is coupled to the isolator 402 such that the steering lens 502 is positioned between the first mirror 608 and the isolator 402. The isolator 402 is coupled to the half wave plate 314. The half wave plate is coupled to the second mirror 316, which is coupled to a third mirror 318. The third mirror is coupled to the third collimating lens 320.

The third collimating lens 320 is coupled to an optical amplifier 322. The optical amplifier 322 can be an SOA. The optical amplifier 322 is configured to receive a focused optical signal from the third collimating lens 320 and output an amplified optical signal to the FP laser diode 302. The FP laser diode 302 and the optical amplifier 322 can be positioned together on submount 324.

In operation, the transmitted and received wavelengths are arranged differently to separate the two signals, for example, C-band wavelengths can be used for transmitting and L-band wavelengths can be used for receiving, or vice versa. Thus, the transmitting and receiving signals allocated at different wavelength spans are spatially separated with C/L band filter 804.

In some implementations, the wavelength of the received signal is in the L-band. As a result, it will follow the light path from the fiber 310, but will be reflected by a C/L band filter 808 while the C-band wavelength signal transmitted out from the FP laser diode 302 and then returned by the fiber 310 as fed back from the self-seeding cavity will transmit through the C/L band filter 808 and into the PBS 306. The angle of a C/L thin film filter of the C/L band filter 808 should be tilted sufficiently large to effectively separate the transmitting and receiving paths yet still small enough for the C/L band filter 808 to separate the C and L band signal effectively on the spectral domain.

Figure 9:
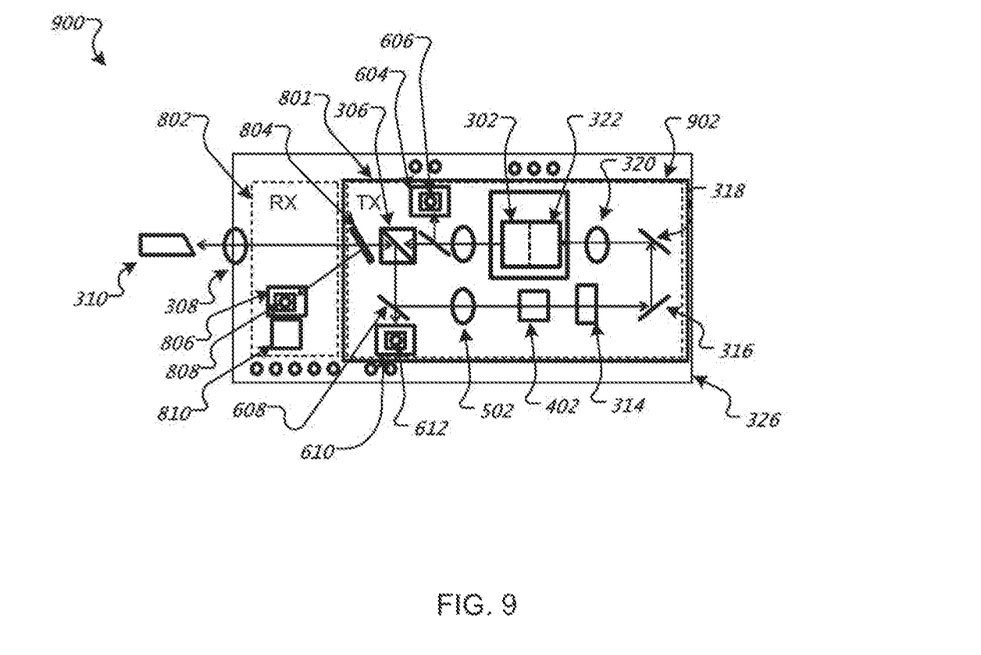
FIG. 9 shows an example of a compact bidirectional WDM optical module with a thermoelectric (TEC) cooler.

FIG. 9 shows an example of a compact bidirectional WDM optical module 900 with a TEC cooler. The WDM optical module 900 is shown as including the components of WDM optical module 800 described above with respect to FIG. 8 and operates in a similar manner. However, in the WDM optical module 900 the transmitter portion 801 is positioned on a TEC cooler 902 to control the temperature of the subassembly. This reduces the performance variation due to some of the optical devices' characteristics being temperature sensitive, since there are many beam manipulating components on the subassembly including collimating, redirecting, steering, and focusing components. The controlled temperature will also reduce the movements of all the optical components due to temperature change and prevent performance degradation.

In some implementations, the transmitter subassembly and receiver subassembly described with respect to FIGS. 8 and 9 are assembled into a package case 326 with lead pins implemented glass sealed feed throughs on both sides of the package case 326 near where either RF or CW signal connections are needed to come out of the package. With the compact transmitter and receiver subassembly designs, even though the relatively cost effective glass feed through type of lead pins occupy certain space and increase the size of the package, the whole package size can still be small enough for its application in the small form factor SFP type of transceiver module application.

Figure 10:
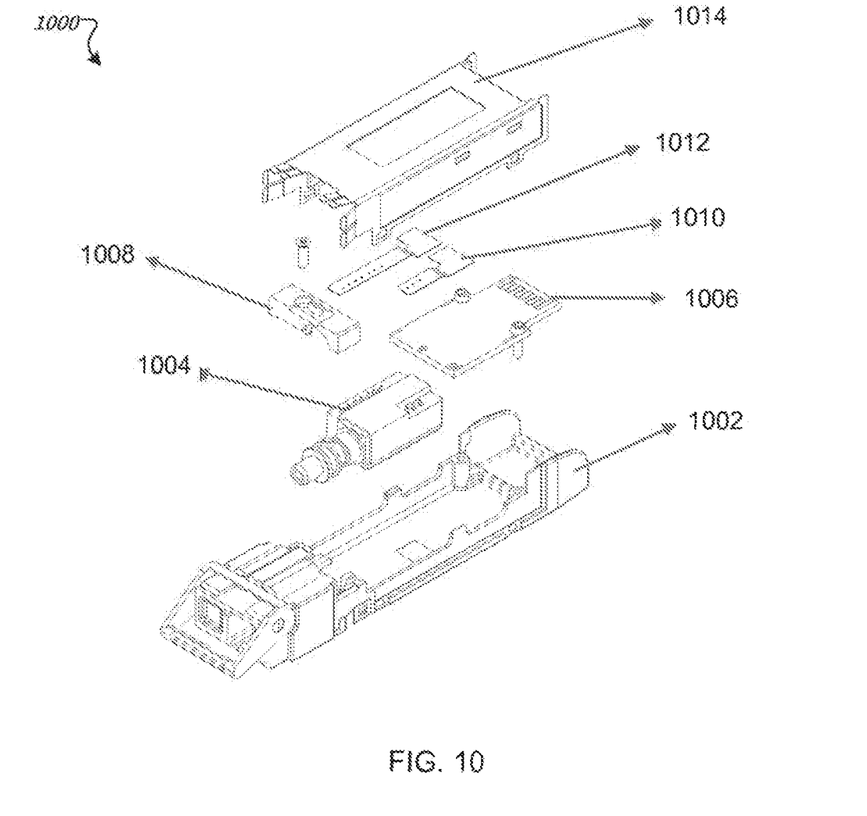
FIG. 10 shows an example of SFP type transceiver built with proposed bidirectional WDM optical module.

FIG. 10 shows an exploded view of an example of SFP type transceiver 1000 built with proposed bidirectional WDM optical module. The transceiver 1000 includes an upper case 1002, a bidirectional WDM optical module 1004, a PCBA 1006, a retainer 1008, a TX FPC 1010, a RX FPC 1012, and a down case 1014.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. An optical assembly comprising:
   a Fabry-Perot (FP) laser diode;
   a first collimating lens coupled to an optical output end of the FP laser diode;
   a polarization beam splitter (PBS) coupled at a first end to receive the collimated optical signal with matched polarization from the first lens;
   a second collimating lens coupled to an optical output from a first end of the PBS and to focus the optical output into a first end of an optical fiber positioned at a second end of the second collimating lens;
   a first mirror coupled to receive an optical output from the PBS;
   a half wave plate coupled to receive an optical output from the first mirror;
   a second mirror coupled to receive an optical output from the half wave plate;
   a third mirror coupled to receive an optical output from the second mirror;
   a third collimating lens coupled to receive an optical output from the third mirror;
   an optical amplifier coupled on a first end to receive a focused optical output from the third collimating lens and configured to output from a second end an optical signal to the FP laser diode,
   wherein an optical input received at the second collimating lens from the optical fiber is a reflected optical signal from the FP laser diode that passes through the second collimating lens, has a polarization such that it is reflected by the PBS by substantially 90 degrees, is folded by substantially 90 degrees by the first mirror, passes through the half-wave plate such that the signal is rotated to match the polarization of the optical amplifier, is folded by the second mirror by substantially 90 degrees, is further folded by the third mirror by substantially 90 degrees, passes through the third collimating lens, passes through the optical amplifier, and then is injected into a rear facet of the FP laser diode.

2. The optical assembly of claim 1, further comprising:
   a wavelength division multiplexer (WDM) filter coupled to receive the optical output from a second end of the optical fiber; and
   a Faraday rotator mirror (FRM) coupled directly or indirectly to an output end of the WDM,
   wherein an output optical signal of the WDM filter is partially reflected by the FRM such that the polarization of a reflected beam is rotated by substantially 90 degrees after transmission through and reflection by the FRM, and wherein the reflected optical signal passes through the WDM filter.

3. The optical assembly of claim 2, wherein the WDM filter is a dense wavelength division multiplexing filter.

4. The optical assembly of claim 1, wherein the optical amplifier is a semiconductor optical amplifier.

5. The optical assembly of claim 4, wherein the semiconductor optical amplifier cancels a modulation of the optical signal that passes through the semiconductor optical amplifier.

6. The optical assembly of claim 1, further comprising an optical isolator optically coupled to the PBS and the optical amplifier such that an enabling beam direction of the optical isolator points to the first end of the optical amplifier.

7. The optical assembly of claim 6, further comprising a steering lens optically coupled to the PBS and the third collimating lens.

8. The optical assembly of claim 7, wherein the first mirror is coated with a partial transmission reflection film such that an optical signal from the PBS can be partially transmitted through it, the optical assembly further comprising:
   a first integrated photodiode and mirror device configured to receive and focus the partially transmitted optical signal from the first mirror;
   a beam splitter coupled on a receiving end to the first lens and on an output end to the PBS such that an optical signal from the FP laser diode is partially reflected; and
   a second integrated photodiode and mirror device configured to receive and focus the partially reflected optical signal from the beam splitter.

9. The optical assembly of claim 8, further comprising a wire bonding connecting an anode and a cathode bonding pad of each photodiode.

10. The optical assembly of claim 9, wherein all the components of the optical assembly are placed on top of a substrate.

11. The optical assembly of claim 10, wherein the substrate is formed from silicon or ceramic.

12. The optical assembly of claim 8, further comprising:
    a C/L band filter coupled on a first end to the PBS; and
    a receiver module coupled to a second end of the C/L band filter,
    wherein the C/L band filter is configured to separate an incoming optical signal into a C-band wavelength output signal and a L-band wavelength signal such that a first output signal follows the previous optical path while a second output signal is reflected.

13. The optical assembly of claim 12, wherein the C/L band filter separates an incoming L-band signal from the PBS such that a L-band signal is reflected onto the receiver while a C-band signal transmits through the C/L band filter into a WDM.

14. The optical assembly of claim 12, wherein all the components of the optical assembly are placed on top of a substrate.

15. The optical assembly of claim 14, wherein the substrate is formed from of silicon or ceramic.

16. The optical assembly of claim 14, wherein the optical assembly is placed in a thermoelectric (TEC) cooler.

17. The optical assembly of claim 14, wherein the optical assembly is contained in a package case with lead pins located on two sides of the package case such that a modulation current going into the FP laser diode or a received AC signal output from the receiver can exit the package case.

* * * * *